United States Patent [19]
Pawlowski

[11] Patent Number: 6,094,703
[45] Date of Patent: Jul. 25, 2000

[54] SYNCHRONOUS SRAM HAVING PIPELINED MEMORY ACCESS ENABLE FOR A BURST OF ADDRESSES

[75] Inventor: J. Thomas Pawlowski, Boise, Id.

[73] Assignee: Micron Technology, Inc., Boise, Id.

[21] Appl. No.: 09/343,121

[22] Filed: Jun. 29, 1999

Related U.S. Application Data

[62] Division of application No. 09/098,037, Jun. 15, 1998, which is a continuation of application No. 08/825,963, Apr. 4, 1997, Pat. No. 5,787,489, which is a continuation of application No. 08/566,719, Dec. 4, 1995, abandoned, which is a continuation-in-part of application No. 08/391,725, Feb. 21, 1995, Pat. No. 5,848,431.

[51] Int. Cl.$^7$ .................................................. G06F 13/14
[52] U.S. Cl. .......................... 711/104; 711/152; 711/169; 710/35
[58] Field of Search .................................. 711/104, 152, 711/169; 710/35

[56] References Cited

U.S. PATENT DOCUMENTS

| | | |
|---|---|---|
| 4,141,068 | 2/1979 | Mager et al. . |
| 4,231,105 | 10/1980 | Schuller et al. . |
| 4,912,630 | 3/1990 | Cochcroft, Jr. . |
| 5,126,975 | 6/1992 | Handy et al. ....................... 365/230.01 |
| 5,384,745 | 1/1995 | Konishi et al. ..................... 365/230.03 |
| 5,490,116 | 2/1996 | Tobita et al. ............................ 365/226 |
| 5,491,663 | 2/1996 | Teel ..................................... 365/189.05 |
| 5,544,121 | 8/1996 | Dosaka et al. ........................... 365/222 |
| 5,550,783 | 8/1996 | Stephens, Jr. et al. ................. 365/233 |
| 5,602,798 | 2/1997 | Sato et al. ............................... 365/233 |
| 5,604,884 | 2/1997 | Thome et al. . |
| 5,787,489 | 7/1998 | Pawlowski ............................. 711/169 |
| 5,809,549 | 9/1998 | Thome et al. ........................... 711/167 |
| 5,848,431 | 12/1998 | Pawlowski ................................. 711/5 |

OTHER PUBLICATIONS

Sony CXK77V3210Q Data Sheet, Rev. 14.0, Oct. 1995.
Horton, Thomas. "Selecting the Right Cache Architecture for High Performance PCs." Sony Semiconductor Company of America, San Jose, CA. Apr. 1995.

(List continued on next page.)

*Primary Examiner*—B. James Peikari
*Attorney, Agent, or Firm*—Wells, St. John, Roberts, Gregory & Matkin, P.S.

[57] ABSTRACT

A synchronous burst SRAM device comprising an SRAM core having a memory array, write drivers, sense amplifiers, and I/O buffers; an address register for receiving addresses for the memory array in the SRAM core; a burst address generator coupled to the address register for rapidly generating additional addresses using at least one address bit stored in the address register; an input for receiving an external address signal indicating that an external address is ready to be loaded into the address register; three chip enable inputs for receiving chip enable signals; chip enable and select logic coupled to the three chip enable inputs to perform the dual tasks of (1) selectively enabling or disabling the synchronous burst SRAM device and (2) selectively permitting access to the SRAM core when the SRAM device is enabled in accordance with a boolean function of the chip enable signals at the three chip enable inputs, the chip enable and select logic outputting an SRAM core enable signal resulting from the boolean function of the chip enable signals; an enable register having an input connected to the chip enable and select logic for temporarily storing the SRAM core enable signal, and having an output; a pipelined enable register coupled between the enable register and the SRAM core for temporarily storing the SRAM core enable signal and delaying propagation of the core enable signal to the SRAM core; and pipelining logic coupled to at least one of the three chip enable inputs to permit pipelining operation of the synchronous burst SRAM device.

17 Claims, 7 Drawing Sheets

OTHER PUBLICATIONS

IBM Press Release. "IBM Introduces Fast 1–Megabit SRAM Family." Jun. 1994.

IBM IBM043614PQKB Data Sheet, May 1994.

Izumikawa, Masanori et al. "A 400MHz, 300mW, 8kb, CMOS SRAM Macro with a Current Sensing Scheme." Custom Integrated Circuits Conference, IEEE, Feb. 1994.

Nakamura, Kazuyuki et al. "A 220MHz Pipelined 16Mb BiCMOS SRAM with PLL Proportional Self–Timing Generator." Solid–State Circuits, 1994 41st Conference, Jul. 1994.

Dickenson, Alex et al. "A Fast Pipelined CMOS SRAM." Tencon '92, IEEE Region 10 Conference, Nov. 1992.

Gowni, Shiva P. et al. "A 9ns, 32k×9 BiCMOS TTL Synchronous Cache RAM with Burst Mode Access." Proceedings of the IEEE 1992 Custom Integrated Circuits Conference, May 1992.

Millman, Jacob, "Microelectronics: Digital and Analog Circuits and Systems", McGraw–Hill, Inc., pp. 290–291, 1979.

Sloan, M. E., "Computer Hardware and Organization: An Introduction", Science Research Associates, Inc., p. 343, 1983.

Handy, Jim, "The Cache Memory Book", Academic Press, pp. 122, 201–205, 1993.

Hennessy et al., "Computer Organization and Design: The Hardware/Software Interface", Morgan Kaufmann Publishers, Inc. p. B–30, 1994.

Hitachi America, Ltd., Semiconductor & I.C. Division, "Hitachi's Synchronous Burst, Pipelined 1Mbit (32K×32) SRAM Meets Industry Demand for Economical, Fast Cache Memory Devices for Pentium PCs", Mar. 13, 1995.

SYNCHRONOUS SRAM HAVING PIPELINED MEMORY ACCESS ENABLE FOR A BURST OF ADDRESSES

CROSS REFERENCE TO RELATED APPLICATION

This is a division of U.S. patent application Ser. No. 09/098,037, filed Jun. 15, 1998, and titled "Synchronous SRAM Having Pipelined Enable", which in turn is a continuation of U.S. patent application Ser. No. 08/825,963, filed Apr. 4, 1997, now U.S. Pat. No. 5,787,489, which in turn is a continuation of Ser. No. 08/566,719, filed Dec. 4, 1995, now abandoned, which is a continuation-in-part of U.S. patent application Ser. No. 08/391,725, filed Feb. 21, 1995, which is now U.S. Pat. No. 5,848,431.

TECHNICAL FIELD

This invention relates to synchronous SRAMs (Static Random Access Memories).

BACKGROUND OF THE INVENTION

Synchronous SRAMs are a type of SRAM that is registered and accessed in accordance with externally generated clock signals. The clock signal provides for synchronous operation of the SRAM. An SRAM is typically used as a cache. A cache is a small, fast redundant memory which duplicates frequently accessed information from a main memory, such as a DRAM.

Figure 1:
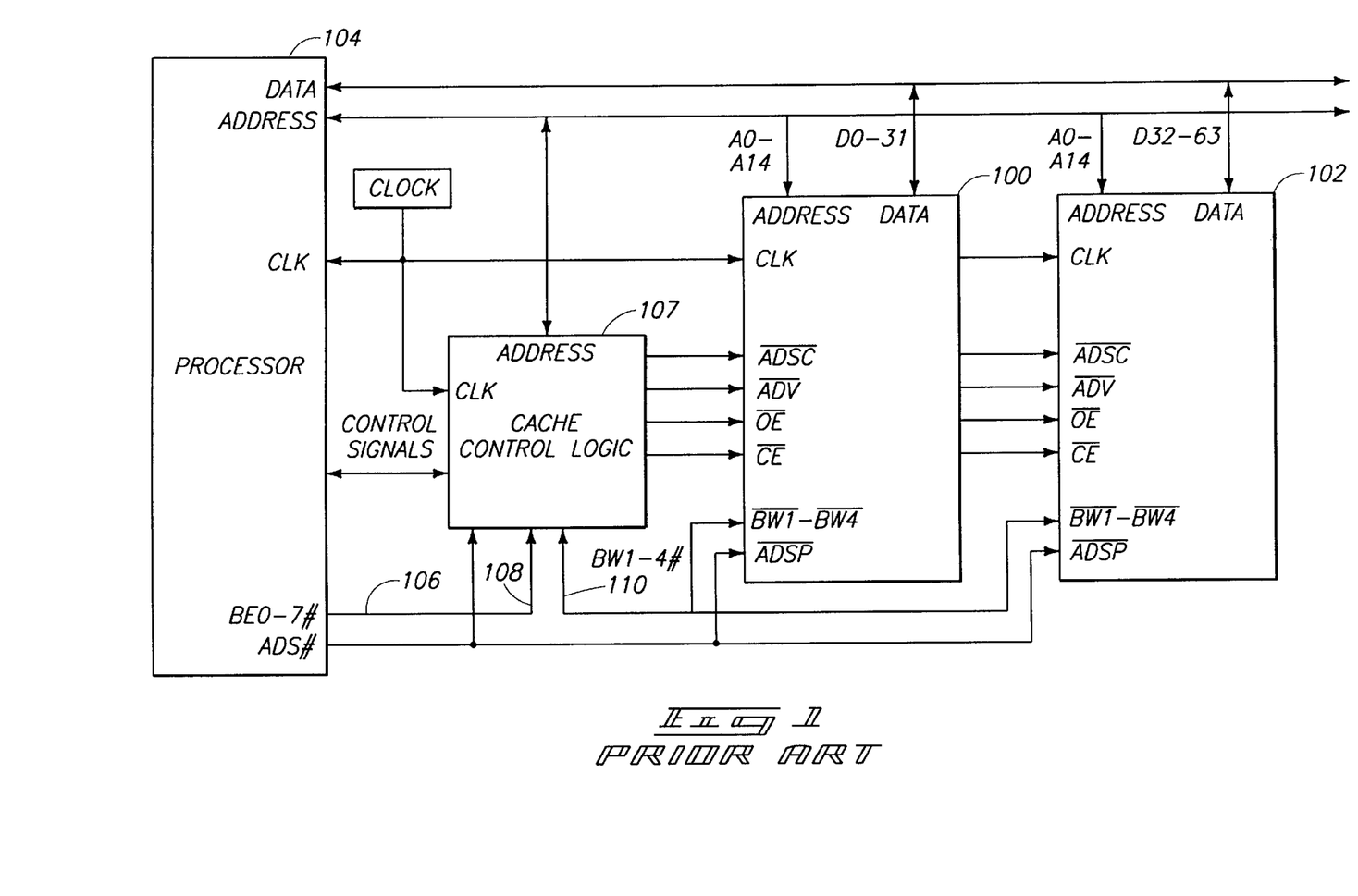
FIG. 1 is a block diagram of a prior art system showing interconnections between a processor, cache control logic, and a pair of synchronous burst SRAMs.

One specific type of synchronous SRAMs is a synchronous burst SRAM which is designed in systems to achieve higher SRAM performance. Synchronous burst SRAMs have an internal counter which facilitates internal addressing of typically two to four addresses for each externally generated address that is loaded into the memory device. The internal "burst" addresses can be generated more rapidly in comparison to externally generating the same addresses and then loading them into the memory device using conventional techniques. Accordingly, the burst SRAMs operate faster and achieve higher performance: A pair of prior art synchronous SRAMs 100 and 102 connected to a 64 bit processor 104 is illustrated in FIG. 1.

The purpose of burst logic included in the above described synchronous burst SRAM is to facilitate cache line operations. A cache line is typically two or four times the data bus width. For example, in a system including a Pentium (TM) processor, the bus width is 64 bits (i.e.; 8 bytes), and the cache line size is 256 bits (i.e.; 32 bytes). Therefore, when a new cache line is read into or out of the SRAM in a system including a 64 bit processor, such as a Pentium (TM), four bus cycles are required, and a burst sequence of length four is is employed. Burst sequences are discussed in greater detail below.

When it is desired to write to the SRAM 100 or 102, the processor 104 generates a byte enable signal on a byte enable line 106. The byte enable signal cannot be connected directly to the SRAM 100 or 102, however, because the byte enable signal from the processor does not distinguish between reads, writes, and other operations such as a snoop cycle.

(Snooping refers to the act of scanning bus activity to see if it is trying to modify information that is duplicated elsewhere. For example, something in cache is a duplicate of data in main memory. If a device tries to modify the data in main memory, it should also be modified in cache so that the data is coherent.)

Cache control logic 107 provides an interface between the synchronous burst SRAMs 100 and 102, and the processor. The cache control logic 107 is typically implemented in an ASIC (Application Specific Integrated Circuit).

In early SRAMs, one signal controlled writing to the SRAM. In later SRAMs, the write signal was split between bytes (e.g., upper byte and lower byte). A standard has thus developed with respect to control logic for synchronous burst SRAMs that requires one byte write input to the SRAM for every 8 or 9 bit width portion of the SRAM. The processor and the control logic both have an influence on the SRAM, and have different requirements of the SRAM.

A 64 bit processor 104, such as the Intel (TM) Pentium (TM), provides 8 byte enable outputs BE0#–BE7# (8 bits per byte). Because the byte enable signal cannot be connected directly to the SRAM 100 or 102, control logic 107 that interfaces a 64 bit processor requires 8 inputs, illustrated collectively as 108, to receive the 8 byte enable signals from the processor, and generates 8 byte write outputs, illustrated collectively as 110. The control logic thus has a total of 16 input/output (IO) lines. The control logic must be fast, making it difficult to implement all of this logic in an ASIC that operates at high frequencies.

The time required for a byte enable signal to travel from the processor into the control logic, propagate through the control logic, drive through output buffers in the control logic and into the SRAM can induce an extra wait state during write cycles. It would be easier to optimize fewer signals in the control logic ASIC 110.

It would therefore be desirable to reduce the number of input/output lines in the control logic ASIC 110.

Further, it is desirable and advantageous for synchronous burst SRAMs to facilitate a microprocessor-related function known as "address pipelining". In general, a processor attached to the synchronous burst SRAM outputs an address and data strobe signal each time a new address is ready for input into the SRAM device. On occasions, it may be desirable to delay execution of that new address. For example, in a synchronous burst SRAM, it might be desirable to continue the burst addressing operation before accepting the next external address. Accordingly, the synchronous burst SRAMs must be capable of blocking or delaying operation on the new address (as indicated by the address and data strobe signal from the processor) until the burst operation is completed.

BRIEF DESCRIPTION OF THE DRAWINGS

Preferred embodiments of the invention are described below with reference to the accompanying drawings, which are briefly described below.

In the drawings and detailed description, the symbol "#", or a bar over an input is used to indicate that a signal is an active low signal.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The synchronous SRAM of this invention includes global write circuitry, which allows a full bus width device write. The synchronous SRAM of this invention further includes individual byte write enable circuitry which allows partial bus write operations (writing of selected individual bytes) to the SRAM.

The synchronous SRAM of this invention also provides an intermediate memory depth without use of external logic. The novel synchronous SRAM also includes a pipelining mode and a power down mode without expensive components or circuitry.

According to one aspect of this invention, a synchronous burst SRAM device comprises an SRAM core having, a memory array, write drivers, sense amplifiers, and I/O buffers; an address register for receiving addresses for the memory array in the SRAM core; a burst address generator coupled to the address register for rapidly generating additional addresses using at least one address bit stored in the address register; an input for receiving an external address signal indicating that an external address is ready to be loaded into the address register; three chip enable inputs for receiving chip enable signals; chip enable and select logic coupled to the three chip enable inputs to perform the dual tasks of (1) selectively enabling or disabling the synchronous burst SRAM device and (2) selectively permitting access to the SRAM core when the SRAM device is enabled in accordance with a boolean function of the chip enable signals at the three chip enable inputs, the chip enable and select logic outputting an SRAM core enable signal resulting from the boolean function of the chip enable signals; an enable register having an input connected to the chip enable and select logic for temporarily storing the SRAM core enable signal, and having an output; a pipelined enable register coupled between the enable register and the SRAM core for temporarily storing the SRAM core enable signal and delaying propagation of the core enable signal to the SRAM core; and pipelining logic coupled to at least one of the three chip enable inputs to block the external address signal when one chip enable signal received at the one chip enable input is at a selected asserted logic level to thereby permit pipelining operation of the synchronous burst SRAM device.

According to another aspect of the invention, a synchronous burst SRAM device comprises an SRAM core having a memory array, write drivers, sense amplifiers, and output buffers; a plurality of write registers connected to the write drivers; an address register for receiving addresses for the memory array in the SRAM core; a burst address generator coupled to the address register for rapidly generating additional addresses using at least one address bit stored in the address register; an input for receiving an external address signal indicating that an external address is ready to be loaded into the address register; three chip enable inputs for receiving chip enable signals; chip enable and select logic coupled to the three chip enable inputs to perform the dual tasks of (1) selectively enabling or disabling the synchronous burst SRAM device and (2) selectively permitting access to the SRAM core when the SRAM device is enabled in accordance with a boolean function of the chip enable signals at the three chip enable inputs, the chip enable and select logic outputting an SRAM core enable signal resulting from the boolean function of the chip enable signals; an enable register having an input connected to the chip enable and select logic for temporarily storing the SRAM core enable signal, and having an output; pipelined enable circuitry coupled between the enable register and the SRAM core, the pipelined enable circuitry including a pipelined enable register that has an input coupled to the output of the enable register, and that has an output, the pipelined enable circuitry further including a first AND gate having an input connected to the output of the pipelined enable register, having an input adapted to be connected via an inverter to an external output enable signal, and having an output; and the pipelined enable circuitry further including a second AND gate having an input connected to the output of first AND gate, having an input connected via an inverter to the logical OR of all the outputs of the write registers, and having an output coupled to the output buffers; and pipelining logic coupled to at least one of the three chip enable inputs to block the external address signal when one chip enable signal received at the one chip enable input is at a selected asserted logic level to thereby permit pipelining operation of the synchronous burst SRAM device.

According to another aspect of the invention, a synchronous burst SRAM device comprises an SRAM core having a memory array, write drivers, sense amplifiers, and output buffers; a plurality of write registers connected to the write drivers; an address register for receiving addresses for the memory array in the SRAM core; a burst address generator coupled to the address register for rapidly generating additional addresses using at least one address bit stored in the address register; an input for receiving an external address signal indicating that an external address is ready to be loaded into the address register; three chip enable inputs for receiving chip enable signals; chip enable and select logic coupled to the three chip enable inputs to perform the dual tasks of (1) selectively enabling or disabling the synchronous burst SRAM device and (2) selectively permitting access to the SRAM core when the SRAM device is enabled in accordance with a boolean function of the chip enable signals at the three chip enable inputs, the chip enable and select logic outputting an SRAM core enable signal resulting from the boolean function of the chip enable signals; an enable register having an input connected to the chip enable and select logic for temporarily storing the SRAM core enable signal, and having an output; pipelined enable circuitry coupled between the enable register and the SRAM core, the pipelined enable circuitry including a pipelined enable register that has an input coupled to the output of the enable register, and that has an output, the pipelined enable circuitry further including a first AND gate having a first input adapted to be connected via an inverter to an external output enable signal, having a second input, and having an output; and the pipelined enable circuitry further including a second AND gate having an input connected to the output of first AND gate, having an input connected via an inverter to the logical OR of all the outputs of the write registers, and having an output coupled to the output buffers; output register bypass circuitry connected between the enable register and the memory core, the output register bypass circuitry including a previous write register having an as input connected to the logical OR of all the outputs of the write registers, and having an output, the output register bypass circuitry further including a third AND gate having an input connected to the output of the previous write register, having an input connected to the output of the enable register, and having an output, and the output register bypass circuitry further including an OR gate having an input connected to the output of the third AND gate, having an input connected to the output of the pipelined enable register, and having an output connected to the second input of the first AND gate; and pipelining logic coupled to at least, one of the three chip enable inputs to block the external address signal when one chip enable signal received at the one chip enable input is at a selected asserted logic level to thereby permit pipelining operation of the synchronous burst SRAM device.

According to another aspect of the invention, a system comprises a processor including a plurality of byte enable outputs; control logic communicating with the processor; a first synchronous SRAM communicating with the processor and the control logic, the first SRAM comprising an SRAM core having a memory array, write drivers, sense amplifiers, and output buffers; address control circuitry for accessing a selected location of the memory array within the SRAM core; a plurality of byte write registers respectively connected to the write drivers, the byte write registers selectively activating corresponding byte write drivers to input data into the memory array during a write operation; a plurality of data inputs organized into bytes; a byte write enable input; a plurality of byte write inputs respectively directly connected to the byte enable outputs of the processor; byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs; a global write input, and global write circuitry connecting the global write input to the byte write registers and selectively causing all bytes of the data inputs to be written into the SRAM core when a predetermined asserted logic level is present on the global write input; first, second, and third chip enable inputs for receiving at least a module enable signal and a memory select enable signal; chip enable and select logic coupled to the first, second, and third chip enable inputs to perform the dual tasks of (1) selectively enabling or disabling the first synchronous burst SRAM and (2) selectively permitting access to the SRAM core when the first SRAM is enabled in accordance with a boolean function of the chip enable signals at the three chip enable inputs, the chip enable and select logic outputting an SRAM core enable signal resulting from the boolean function of the chip enable signals; an enable register having an input connected to the chip enable and select logic for temporarily storing the SRAM core enable signal, and having an output; pipelined enable circuitry coupled between the enable register and the SRAM core, the pipelined enable circuitry including a pipelined enable register that has an input coupled to the output of the enable register, and that has an output, the pipelined enable circuitry further including a first AND gate having a first input adapted to be connected via an inverter to an external output enable signal, having a second input, and having an output; and the pipelined enable circuitry further including a second AND gate having an input connected to the output of first AND gate, having an input connected via an inverter to the logical OR of all the outputs of the byte write registers, and having an output coupled to the output buffers; output register bypass circuitry connected between the enable register and the SRAM core, the output register bypass circuitry including a previous write register having an input connected to the logical OR of all the outputs of the byte write registers, and having an output, the output register bypass circuitry further including a third AND gate having an input connected to the output of the previous write register, having an input connected to the output of the enable register, and having an output, and the output register bypass circuitry further including an OR gate having an input connected to the output of the third AND gate, having an input connected to the output of the pipelined enable register, and having an output connected to the second input of the first AND gate; and pipelining logic coupled to at least one of the three chip enable inputs to block the external address signal when one chip enable signal received at the one chip enable input is at a selected asserted logic level to thereby permit pipelining operation of the SRAM; and a second synchronous SRAM communicating with the processor and the control logic, the second SRAM comprising an SRAM core having a memory array, write drivers, sense amplifiers, and output buffers; address control circuitry for accessing a selected location of the memory array within the SRAM core of the second SRAM; fourth, fifth, and sixth chip enable inputs for receiving at least a module enable signal and a memory select enable signal; chip enable and select logic coupled to the fourth, fifth, and sixth chip enable inputs to perform the dual tasks of (1) selectively enabling or disabling the second SRAM and (2) selectively permitting access to the SRAM core of the second SRAM when the second SRAM is enabled in accordance with a boolean function of the chip enable signals at the three chip enable inputs of the second SRAM, the chip enable and select logic of the second SRAM outputting an SRAM core enable signal resulting from the boolean function of the chip enable signals; an enable register having an input connected to the chip enable and select logic of the second SRAM for temporarily storing the SRAM core enable signal of the second SRAM, and having an output; pipelined enable circuitry coupled between the enable register and the SRAM core of the second SRAM, the pipelined enable circuitry of the second SRAM including a pipelined enable register that has an input coupled to the output of the enable register of the second SRAM, and that has an output, the pipelined enable circuitry further including a fourth AND gate having a first input adapted to be connected via an inverter to an external output enable signal, having a second input, and having an output; and the pipelined enable circuitry of the second SRAM further including a fifth AND gate having an input connected to the output of fourth AND gate, having an input connected via an inverter to the logical OR of all the outputs of the byte write registers of the second SRAM, and having an output coupled to the output buffers of the second SRAM; output register bypass circuitry connected between the enable register and the memory core of the second SRAM, the output register bypass circuitry of the second SRAM including a previous write register having an input connected to the logical OR of all the outputs of the byte write registers of the second SRAM, and having an output, the output register bypass circuitry further including a sixth AND gate having an input connected to the output of the previous write register of the second SRAM, having an input connected to the output of the enable register of the second SRAM, and having an output, and the output register bypass circuitry of the second SRAM further including an OR gate having an input connected to the output of the sixth AND gate, having an input connected to the output of the pipelined enable register, and having an output connected to the second input of the fourth AND gate; and pipelining logic coupled to at least one of the fourth, fifth; and sixth chip enable inputs to block the external address signal when one chip enable signal received at the one chip enable input is at a selected asserted logic level to thereby permit pipelining operation of the second SRAM; means for providing a memory select enable signal selecting the first SRAM when the memory select enable signal is at one asserted logic level and selecting the second SRAM when the memory select enable signal is at another asserted logic level; and means for providing a module enable signal enabling operation of both SRAMs when the module enable signal is at one asserted logic level and disabling operation of both SRAMs when the module enable signal is at another asserted logic level.

Figure 2:
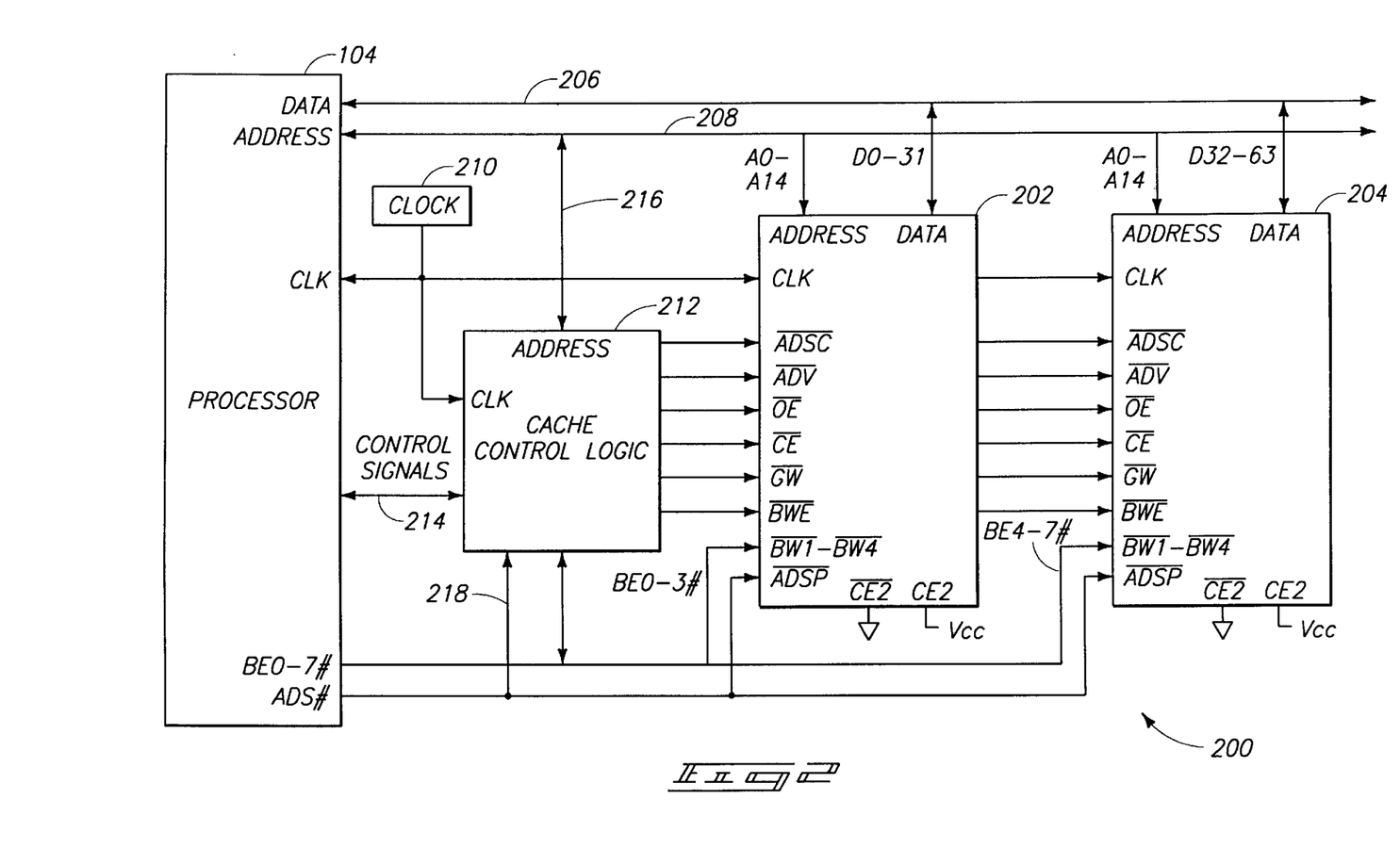
FIG. 2 is a block diagram of a system in accordance with the invention and showing interconnections between a processor, cache la control logic, and a pair of synchronous burst SRAMs.

FIG. 2 illustrates a system 200 including a processor 104 having a plurality of byte enable outputs BE0#–BE7#, an SRAM unit 202 having a plurality of byte write inputs $\overline{BW1}$–$\overline{BW4}$ connected directly to four of the byte enable outputs, namely to BE0#–BE3#, and an SRAM unit 204 having a plurality of byte write inputs $\overline{BW1}$–$\overline{BW4}$ connected directly to remaining byte enable outputs, namely BE4#–BE7#.

In the illustrated embodiment, the processor 104 is a 64 bit Pentium (TM) processor manufactured by Intel. However, the application has application to systems comprising any multiple byte processors. The processor 104 includes conventional inputs and outputs which are known in the art, and will not be discussed in detail. For example, the illustrated processor 104 includes data, address, clock, control signal, byte enable, and address status (ADS#) pins. The SRAM unit 202 and the SRAM unit 204 might both be 32 k×36 or 32 k×32 synchronous SRAMs. The system 200 includes a data bus 206 over which data is transferred between the SRAM units 202 and 204. The system 200 further includes an address bus 208 used for addressing. The system 200 also includes a clock 210 providing clock pulses to the processor 104, the SRAM unit 202, and the SRAM unit 204.

The system 200 further includes a cache control logic ASIC 212 which receives and sends control signals from and to the processor 104 over lines 214, which receives and sends addresses from and to the address bus 208 over lines 216, which receives address status signals from the processor over lines 218, and which provides various signals $\overline{ADSC}$, $\overline{ADV}$, $\overline{OE}$, $\overline{CE}$, $\overline{GW}$, and $\overline{BWE}$ (described below in greater detail) to the SRAM units 202 and 204.

Figure 3:
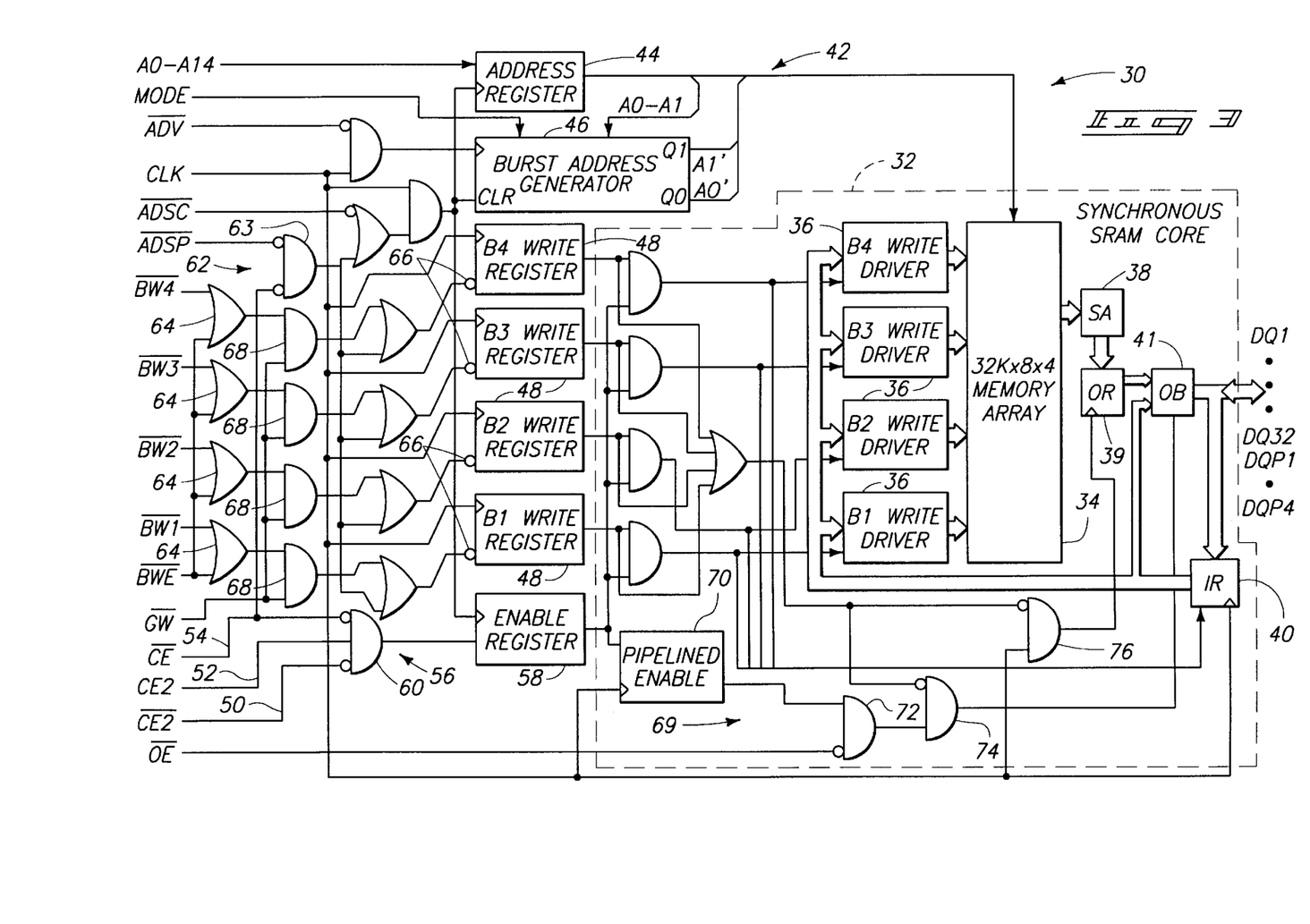
FIG. 3 is a block diagram of a synchronous burst SRAM device according to this invention.

FIG. 3 shows a preferred construction of a synchronous burst SRAM device 30 which can be incorporated as one of the SRAM units 202 and 204 in system 200. Synchronous burst SRAM device 30 includes an SRAM core 32. Synchronous SRAM core 32 includes a memory array 34, and one or more byte write drivers 36 for temporarily holding data for input into the memory array 34. The byte write drivers 36, if enabled, drive data lines in the memory array 34 to appropriate levels for a write to occur. The synchronous SRAM core 32 further includes sense amplifiers 38, and I/O buffers (such as input registers 40 and output register 41 and optionally output registers 39) to facilitate transfer of data to and from the memory a array. Input registers 40 take TTL (transistor—transistor logic) input and capture it at the rising edge of the clock signal CLK. Output registers 39 are responsive to an AND gate 76 that has a first input connected to a clock 210, and a second input connected, via an inverter, to the logical OR of the outputs of all the write registers 48.

Address control circuitry 42 is coupled to SRAM core 32 for accessing a selected location in the memory array within the SRAM core. Preferably, address control circuitry 42 comprises an address register 44 for receiving externally generated addresses A0–A14 and a burst address generator 46 coupled to the address register 44 and to an externally generated mode signal (MODE). The mode signal selects the burst sequence for compatibility with different types of processors 104. If MODE is low, a linear burst sequence is selected for compatibility with a PowerPC (TM) processor; otherwise, an interleaved burst mode is selected for compatibility with an Intel (TM) processor. The burst address generator 46 rapidly generates additional internal addresses using at least one, and preferably two or more, address bits stored in the address register. In this construction, burst address generator 46 comprises a two bit binary counter or other equivalent logic which employs the two least significant bits (LSB) A0 and A1 to generate additional addresses internally at a much higher rate as compared to external generation of the same addresses.

The SRAM device 30 includes a synchronous address advance input $\overline{ADV}$. In the illustrated embodiment, the synchronous address advance input $\overline{ADV}$ is an active low input which is coupled to the burst address generator 46 and which is used to advance the counter. in the burst address generator 46. If the address advance input $\overline{ADV}$ is high, wait states are generated; if the address advance input $\overline{ADV}$ is low, and a new external address is not being loaded, an address advance takes place. If the linear burst mode is selected, a simple binary up counter sequence is followed with any overflow of the counter ignored. Only the least significant bits A0 and A1 are affected. A sample counting sequence is 00, 01, 10, 11, followed by a wrap (discarding overflow) to 01, then 10, 11, 00, etc. If starting with 10, the advances would be to 11, 00, 01, etc. If starting with 11, the advances would be to 00, 01, 10, etc. If the interleaved burst is selected, the least significant bits A0 and A1 are advanced using a formula:

initial sequence=A1 A0, next=A1 $\overline{A0}$, next=$\overline{A1}$ A0, next=$\overline{A1}$ $\overline{A0}$ Sample sequences are:
00, 01, 10, 11 (same as the linear sequence starting with 00)
01, 00, 11, 10 (different from the linear sequence starting with 01)
10, 11, 00, 10 (same as the linear sequence starting with 10)
11, 10, 01, 00 (different from the linear sequence starting with 11).

Synchronous burst SRAM device 30 has multiple one-bit "byte write" registers 48 which activate corresponding write drivers 36 to input data into the memory array 34 during a write operation. When write registers 48 hold one binary bit, such as a "1", write drivers 36 are enabled to transfer data to memory array 34; whereas, when write registers 48 hold the other binary bit, such as a "0", the write drivers are not enabled indicating that a read operation is being performed. The write registers 48 are controlled by signals on respective synchronous byte write inputs $\overline{BW1}$, $\overline{BW2}$, $\overline{BW3}$, and $\overline{BW4}$ and a clock input signal CLK. The operation of write registers 48 is also partially controlled by the logical combination of the module enable signal $\overline{CE}$ is and an external address signal $\overline{ADSP}$. In this embodiment, the external address signal is in the form of an address and data strobe from the processor 104 which indicates that an external address is ready to be loaded into address register 44. In the illustrated embodiment, the byte write inputs $\overline{BW1}$, $\overline{BW2}$, $\overline{BW3}$, and $\overline{BW4}$ are active low inputs.

The SRAM device 30 further includes a byte write enable input $\overline{BWE}$. The SRAM device 30 further includes byte write enable circuitry which allows partial bus write operations (writing of selected individual bytes) to the SRAM device 30 depending on the asserted logic level of the byte write enable input $\overline{\text{BWE}}$. In the illustrated embodiment, the byte write enable input $\overline{\text{BWE}}$ is an active low input. The byte write enable circuitry comprises a plurality of OR gates 64. The SRAM device 30 further includes invertors 66 associated with respective byte write registers 48. The OR gates 64 respectively have a first input connected to the byte write enable input $\overline{\text{BWE}}$, a second input connected to one of the byte write inputs $\overline{\text{BW1}}$, $\overline{\text{BW2}}$, $\overline{\text{BW3}}$ and $\overline{\text{BW4}}$, and an output connected to a corresponding one of the byte write registers 48, via one of the invertors 66. If the byte write inputs and byte write enable input were active high inputs, then AND gates would be substituted for the OR gates 64, and the invertors 66 would be omitted.

Because of the provision of the byte write enable circuitry, individual bytes can be written using $\overline{\text{BW1}}$, $\overline{\text{BW2}}$, $\overline{\text{BW3}}$, and $\overline{\text{BW4}}$. $\overline{\text{BW1}}$ controls a byte defined by data bits DQ1–DQ8, $\overline{\text{BW2}}$ controls a byte defined by data bits DQ9–DQ16, $\overline{\text{BW3}}$ controls a byte defined by data bits DQ17–DQ24 and DQP3, and $\overline{\text{BW4}}$ controls a byte defined by data bits DQ25–DQ32 and DQP4, conditioned on $\overline{\text{BWE}}$ being low.

The SRAM device 30 includes a global write input $\overline{\text{GW}}$. The SRAM device 30 further includes global write circuitry, which forces all bytes to be written into the SRAM (a full bus width device write; e.g., a full 32-bit write), independent of the $\overline{\text{BWE}}$, $\overline{\text{BW1}}$, $\overline{\text{BW2}}$, $\overline{\text{BW3}}$ and $\overline{\text{BW4}}$ inputs, depending on the asserted logic level of the $\overline{\text{GW}}$ input. In the illustrated embodiment, the $\overline{\text{GW}}$ input is an active low input. When $\overline{\text{GW}}$ is low, all bytes are written. The global write circuitry comprises a plurality of AND gates 68. The AND gates 68 respectively have a first input connected to the global write input $\overline{\text{GW}}$, a second input connected to one of the byte write inputs $\overline{\text{BW1}}$, $\overline{\text{BW2}}$, $\overline{\text{BW3}}$ and $\overline{\text{BW4}}$ (more particularly, to the output of one of the OR gates 64), and an output connected to a corresponding one of the byte write registers 48, via one of the invertors 66. If the byte write inputs and byte write enable input were active high inputs, then OR gates would be substituted for the AND gates 68, and the invertors 66 would be omitted.

The remaining inputs to the SRAM device 30 include: an address advance signal input, $\overline{\text{ADV}}$, which is used to increment the binary counter in the burst address generator 46; a synchronous address status processor input $\overline{\text{ADSP}}$; a synchronous address status controller input, $\overline{\text{ADSC}}$; three chip enable inputs, $\overline{\text{CE2}}$, CE2, and $\overline{\text{CE}}$; and an output enable input $\overline{\text{OE}}$. In the illustrated embodiment, the address advance signal input $\overline{\text{ADV}}$, the synchronous address status processor input $\overline{\text{ADSP}}$, the synchronous address status controller input, $\overline{\text{ADSC}}$, chip enable inputs $\overline{\text{CE2}}$, and $\overline{\text{CE}}$, and the output enable input $\overline{\text{OE}}$, are all active low inputs, and the chip enable input CE2 is an active high input.

The synchronous address status processor input $\overline{\text{ADSP}}$ is used to interrupt any ongoing burst, and causes a new external address to be registered. A read operation is performed using the new address, independent of the values of the signals at $\overline{\text{BW1}}$, $\overline{\text{BW2}}$, $\overline{\text{BW3}}$, $\overline{\text{BW4}}$, $\overline{\text{GW}}$, and $\overline{\text{BWE}}$, and independent of the values of the signal at the input $\overline{\text{ADSC}}$, but dependent on the values of the signals at the inputs CE2 and $\overline{\text{CE2}}$. $\overline{\text{ADSP}}$ is ignored if $\overline{\text{CE}}$ is high.

The synchronous address status controller input $\overline{\text{ADSC}}$ is used to interrupt any ongoing burst, and causes a new external address to be registered. A read operation is performed using the new address, unless a write is indicated by the values of the signals at $\overline{\text{BW1}}$, $\overline{\text{BW2}}$, $\overline{\text{BW3}}$, $\overline{\text{BW4}}$, $\overline{\text{GW}}$, and $\overline{\text{BWE}}$, in which case a write is performed, but either operation is dependent on the values of the signal at the inputs CE2, $\overline{\text{CE2}}$, and $\overline{\text{CE}}$.

The SRAM device 30 includes various logic gates (such as AND and OR gates), connecting the above discussed components in a conventional manner, which will not be discussed herein in any detail.

When the SRAM device 30 of FIG. 3 is used as SRAM unit 202, and another SRAM device 30 of FIG. 3 is used as SRAM unit 204 in the system 200 of FIG. 2, only the byte write enable signal $\overline{\text{BWE}}$ needs to be speed optimized in the control logic 212. This is in contradistinction to prior art control logic ASICs, for which processor byte enable outputs BE0#–BE7# would all have to propagate through the logic of the ASIC and to the SRAM. The design of the SRAM device 30 permits direct connection of the byte enable outputs BE0#–BE7# from the processor 104 to the SRAM 202 and SRAM 204.

As in prior art control logic ASICs, the control logic 212 validates whether current cycle will operate on the SRAM 202 or 204. More particularly, the control logic 212 determines if this is a valid cycle for passing data to the SRAM 202. If the control logic 212 determines that this is a write cycle, and if there is data to cache ("cache hit"), and if a processor byte enable output BE0#–BE7# is low, then a low $\overline{\text{BWE}}$ signal is produced by the control logic 212 and applied to the SRAM 202 or 204. The SRAM 202 receives low signals at each byte write input, $\overline{\text{BW1}}$, $\overline{\text{BW2}}$, $\overline{\text{BW3}}$, and $\overline{\text{BW4}}$, for which a low signal is present at the corresponding processor byte enable output BE0#–BE7#.

In alternative embodiments (not shown), the SRAM memory array 34 is sized appropriately for use in other multiple byte systems such as 64, or 128 bit systems. In such embodiments, the memory array 34 has widths of 8 or 16 bytes, respectively, instead of 4 bytes.

In other alternative embodiments, the memory array 34 is half as wide and twice as tall as the array shown in FIG. 3. In such embodiments, there are only 2 byte write drivers, 2 byte write inputs, etc.

In yet other alternative embodiments, the memory array 34 is 64 bits wide. In such embodiments, there are 8 byte write drivers, 8 byte write inputs, etc.

Figure 4:
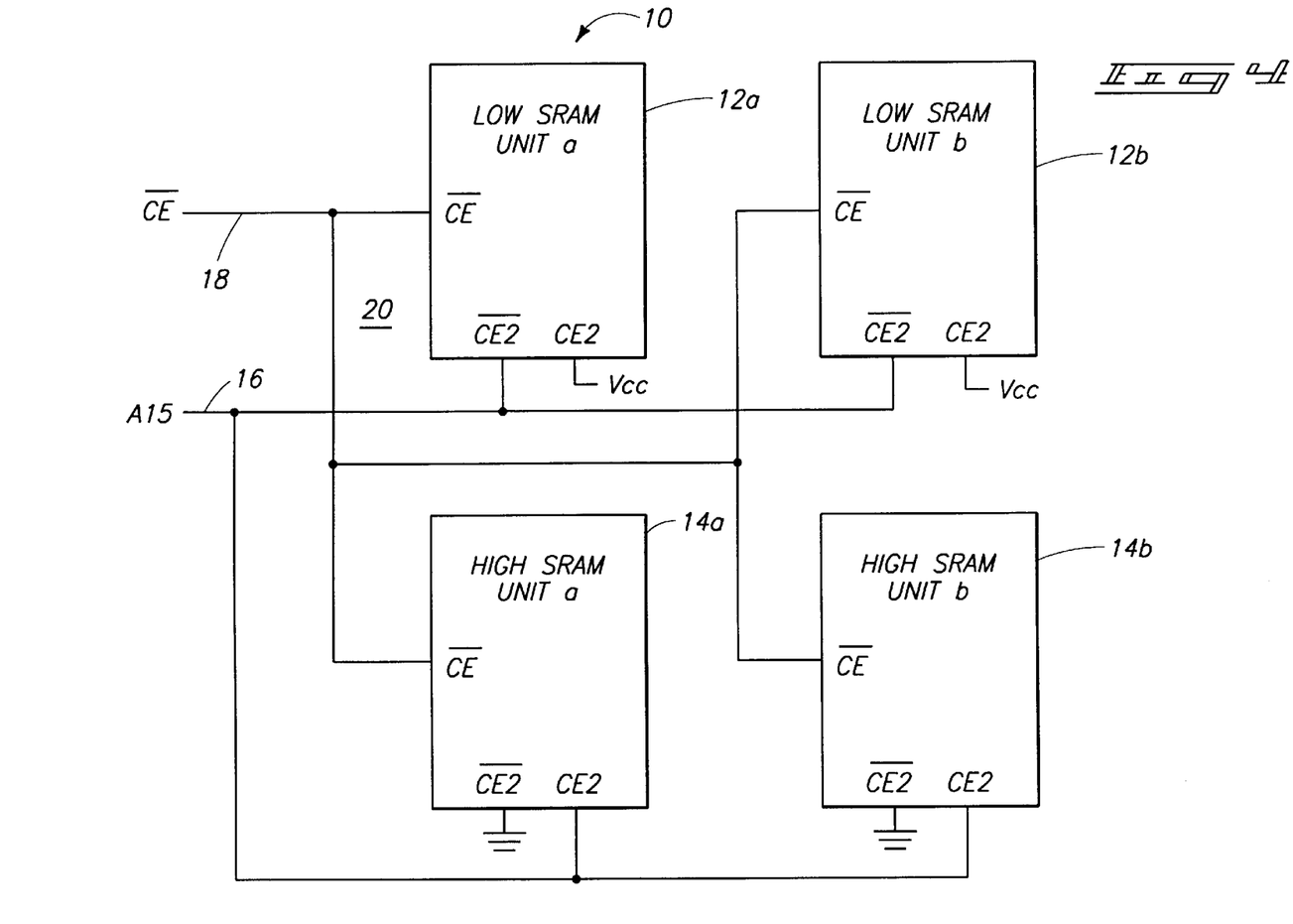
FIG. 4 is an SRAM module providing memory depth expansion.

FIG. 4 illustrates how depth expansion is accomplished using additional SRAM units and chip enable inputs, $\overline{\text{CE2}}$, CE2, and $\overline{\text{CE}}$ of the SRAM units. More particularly, FIG. 4 illustrates a synchronous SRAM module 10 designed to provide an intermediate-sized memory device. The SRAM module 10 includes first (or low) SRAM units 12a and 12b of a common memory size which are stacked with second (or high) SRAM units 14a and 14b of a common memory size to effectively double the memory capacity. For example, first SRAM units 12a and 12b, and second SRAM units 14a and 14b might each be 32 k×32 synchronous SRAMs substantially identical in construction to the SRAM device 30 shown in FIG. 3, except with a 32 k×32 memory array instead of the 32 k×36 memory array 34 illustrated in FIG. 3. When the first SRAM units 12a and 12b are coupled together with the second SRAM units 14a and 14b as shown in FIG. 4, a 64 k×64 synchronous SRAM module 10 is formed.

Each of the SRAM units 12a, 12b, 14a, and 14b are equipped with three chip enable inputs. The three chip enable inputs are advantageous over prior art designs in that they serve the dual tasks of permitting selection of either the first SRAM units 12a and 12b or the second SRAMs units 14a. and 14b, while also providing a means for powering down or disabling both the first SRAM units 12a and 12b, and the second SRAM units 14a. and 14b simultaneously.

More particularly, each SRAM unit 12a, 12b, 14a and 14b has a first chip enable input $\overline{\text{CE2}}$, a second chip enable input CE2, and a third chip enable input $\overline{CE}$. The first chip enable inputs $\overline{CE2}$ of first SRAM units 12a and 12b, and the second chip enable inputs CE2 of second SRAM units 14a and 14b, are tied together to receive a memory select enable signal over conductor 16. In a system, conductor 16 is frequently an address line. The second chip enable inputs CE2 of the first SRAM units 12a and 12b are connected to power $V_{CC}$, and the first chip enable inputs $\overline{CE2}$ of the second SRAM units 14a and 14b are connected to ground.

According to this circuit construction, the memory select enable signal applied over conductor 16 operably chooses between the first a SRAM units 12a and 12b, and the second SRAM units 14a and 14b according to the asserted logic level of the signal. When the memory select enable signal is at one asserted logic level (e.g.; low), first SRAM units 12a and 12b are chosen. Conversely, second SRAM units 14a and 14b are selected when the memory select enable signal is at another asserted logic level (e.g.; high). In the preferred embodiment, the memory select enable signal is a bit in an address used to access the memory arrays in the first SRAM units 12a and 12b, or the second SRAM units 14a and 14b. As illustrated in FIG. 4, the most significant bit (MSB) A15 is used as the memory select enable signal to operably choose between the first SRAM units 12a and 12b, and the second SRAM units 14a and 14b.

A module enable signal $\overline{CE}$ is, coupled via conductor 18 to the third chip enable input $\overline{CE}$ of the SRAM units 12a, 12b, 14a, and 14b. The module enable signal enables operation of all SRAM units 12a, 12b, 14a, and 14b when the signal is at one asserted logic level (e.g.; low), and disables operation of both SRAM units when the module enable signal is at another asserted logic level (e.g.; high). Memory module 10 of this invention is therefore advantageous over prior art designs in that it permits the entire module (comprising multiple SRAM units) to be completely powered down.

The illustrated coupling arrangement for stacking first SRAM units 12a and 12b, and second SRAM units 14a, and 14b is one preferred construction of a module enable and memory selection circuit 20 which in part controls operation of the synchronous SRAM module 10. It should be noted that other coupling arrangements defining circuit 20 can be used. For example, conductor 16 can be coupled to the second chip enable inputs CE2 of the first SRAM units 12a and 12b, and to the first chip enable inputs $\overline{CE2}$ of the second SRAM units 14a and 14b. In this alternative construction, the first chip enable inputs $\overline{CE2}$ of the first SRAM units 12a and 12b would be connected to ground, and the second chip enable inputs CE2 of the second SRAM units 14a and 14b would be connected to power.

For purposes of continuing discussion, assume that synchronous burst SRAM device 30 shown in FIG. 3 is used as the SRAM unit 12a in the SRAM module 10 of FIG. 4. As shown in FIG. 4, the first chip enable input $\overline{CE2}$ (referenced by numeral 50 in FIG. 3) is coupled to receive the MSB A15, the second chip enable input CE2 (referenced by numeral 52) is tied to power $V_{CC}$, and the third chip enable input $\overline{CE}$ (referenced by numeral 54) is connected to receive the module enable signal.

Synchronous burst SRAM device 30 also includes chip enable and select logic 56 coupled to the three chip enable inputs 50, 52, and 54. The chip enable and select logic 56 performs the dual functions of (1) selectively enabling or disabling the synchronous burst SRAM device, and (2) selectively permitting access to the SRAM core 32 when the SRAM device is enabled. These functions are achieved based upon a boolean function of the signals at the three chip enable inputs. The chip enable and select logic 56 generates an SRAM core enable signal for enabling SRAM core 32 as a result of the boolean function provided by logic 56. A one-bit enable register 58 is coupled between the chip enable and select logic 56, and the SRAM core 32 (via pipelined enable circuitry 69, described below) for temporarily storing ii the SRAM core enable signal. In this manner, the SRAM core is merely responsive to a single enable signal held in register 58, although this single core enable signal is generated according to a relationship among the three chip enable signals to the entire SRAM device.

In the preferred form, chip enable and select logic 56 comprises an AND gate 60 having three inputs coupled to the three chip enable inputs 50, 52, 54 and an output coupled to enable register 58.

SRAM device 30 also includes address pipelining logic 62 which is coupled to at least one of the three chip enable inputs, and more specifically, to the third chip enable input 54. Pipelining logic 62 is provided to block the external address signal $\overline{ADSP}$ from notifying the chip that an external address is waiting to be loaded into the address register. This signal blocking function permits the synchronous burst SRAM device to operate in a pipelining mode. An example operation in the pipelining mode is to allow the burst address generator 46 to generate multiple additional addresses without interference from an external address as indicated by the external address signal $\overline{ADSP}$.

The pipelining logic 62 comprises a NOR gate 63 having one input tied to the processor produced address and data strobe $\overline{ADSP}$ and one input coupled to the module enable signal at third chip enable input 54. In this manner, when the module enable signal at input 54, is at a selected asserted logic level (e.g.; high), pipelining logic 62 blocks the external address signal $\overline{ADSP}$ from affecting operation of the SRAM device to thereby permit pipelining operation.

The SRAM device 30 includes pipelined enable circuitry 69 that eliminates the need for dummy reads. The pipelined enable circuitry 69 includes a one-bit pipelined enable register 70 that has an input coupled to the output of the enable register 58, that is clocked by an external clock 210, and that has an output. The pipelined enable circuitry 69 further includes an AND gate 72 having an input connected to the output of the pipelined enable register 70, having an input connected via an inverter to the output enable $\overline{OE}$, and having an output. The pipelined enable circuitry 69 further includes an AND gate 74 having an input connected to the output of AND gate 72, having an input connected via an inverter to the logical OR of all the outputs of the write registers 48, and having an output coupled to the output buffers 41. The pipelined enable circuitry 69, including pipelined enable register 70 and the AND gates 72 and 74, delays data from being output until it is safe to drive data onto the data bus.

Pipelined synchronous SRAMs, the operation of which is initiated at a clock edge, require a following clock edge to clock the output of the SRAM. If proper pipelining logic is not provided for the chip enables $\overline{CE2}$, CE2, and $\overline{CE}$, unnecessary commands are required, such as a dummy read, the results of which is ignored, resulting in inefficient bus operation.

For example, in the absence of pipelining logic 62 and enable register 58, at clock edge 0, a read is requested and the SRAM 30 is enabled. At clock edge 1, output data is ready to be clocked out, and the SRAM 30 must be requested to perform a dummy read. At clock edge 2, the SRAM 30 is ready to output the dummy read, and this output is ignored.

By providing the pipelined enable circuitry 69, in addition to the enable register 58, the SRAM 30 provides output data which tracks the requested address. Without the pipelined enable circuitry 69, if an address and enable sent from the processor is received by the SRAM 30, the requested data would be retrieved from the memory array for delivery to the outputs DQ1–DQ32 and DQP1–DQP4 during the next clock cycle. However, the data would not emerge if a disable command from a processor follows immediately after the enable command. In other words, without the pipelined enable circuitry 69, the following sequence occurs. At clock edge 0, the processor enables the SRAM 30 and requests a read from address A. At clock edge 1, the processor disables the SRAM 30. At clock edge 2, there is no new request to the SRAM 30, and the outputs of the SRAM 30 are off. At clock edge 3, there is no new request to the SRAM 30, and the outputs of the SRAM 30 are off. The data requested by the processor never emerges at the outputs DQ1–DQ32 and DQP1–DQP4 of the SRAM 30.

By providing the pipelined enable circuitry 69, the following sequence occurs. At clock edge 0, the processor enables the SRAM 30 and requests a read from address A. At clock edge 1, the processor disables the SRAM 30. At clock edge 2, there is no new request to the SRAM 30, and data is available at the outputs of the SRAM 30. At clock edge 3, there is no new request to the SRAM 30, and the outputs of the SRAM 30 are off. The data requested by the processor does emerge at the outputs DQ1–DQ32 and DQP1–DQP4 of the SRAM 30.

The pipelined enable circuitry 69 also permits another operation involving SRAMs that are stacked together, such as when two 32 k×36 SRAMs are stacked to form a 64 k×36 memory. For example, the SRAMs 12a and 14a in FIG. 4 are stacked together as are the SRAMs 12b and 14b in FIG. 4.

By providing the pipelined enable circuitry 69 in SRAMs 12a, 14a, 12b, and 14b, the following sequence can occur. At clock edge 0, the processor enables the SRAMs 12a and 12b, disables the SRAMs 14a and 14b, and requests a read from address A. At clock edge 1, the processor disables the SRAMs 12a and 12b, enables the SRAMs 14a and 14b, and requests a read from address B. At clock edge 2, there is no new request from the processor, and data is available at the outputs of the SRAMs 12a and 12b. At clock edge 3, there is no new request from the processor, data is available at the outputs of the SRAMs 14a. and 14b, and the outputs of the SRAMs 12a and 12b are off. Thus, data requested by the processor intelligently emerge at the outputs of the SRAMs.

In the absence of the pipelined enable circuitry 69 in SRAMs 12a, 14a, 12b, and 14b, the following undesirable sequence would occur. At clock edge 0, the processor enables the SRAMs 12a and 12b, disables the SRAMs 14a and 14b, and requests a read from address A. At clock edge 1, the processor disables the SRAMs 12a and 12b, enables the SRAMs 14a and 14b, and requests a read from address B. At clock edge 2, there is no new request from the processor, and no data is available at the outputs of the SRAMs 12a and 12b. At clock edge 3, there is no new request from the processor (i.e. SRAMs 12a, 12b, 14a and 14b are all disabled), no data is available at the outputs of the SRAMs 14a and 14b, and the outputs of the SRAMs 12a and 12b are off. Thus, data requested by the processor from the outputs of SRAMs 12a and 12b do not emerge. Further, even the data from the SRAMs 14a and 14b would not emerge at clock edge 3 if at clock edge 2 the processor made a new request to SRAMs 12a and 12b that simultaneously disabled SRAMs 14a and 14b.

Figure 5:
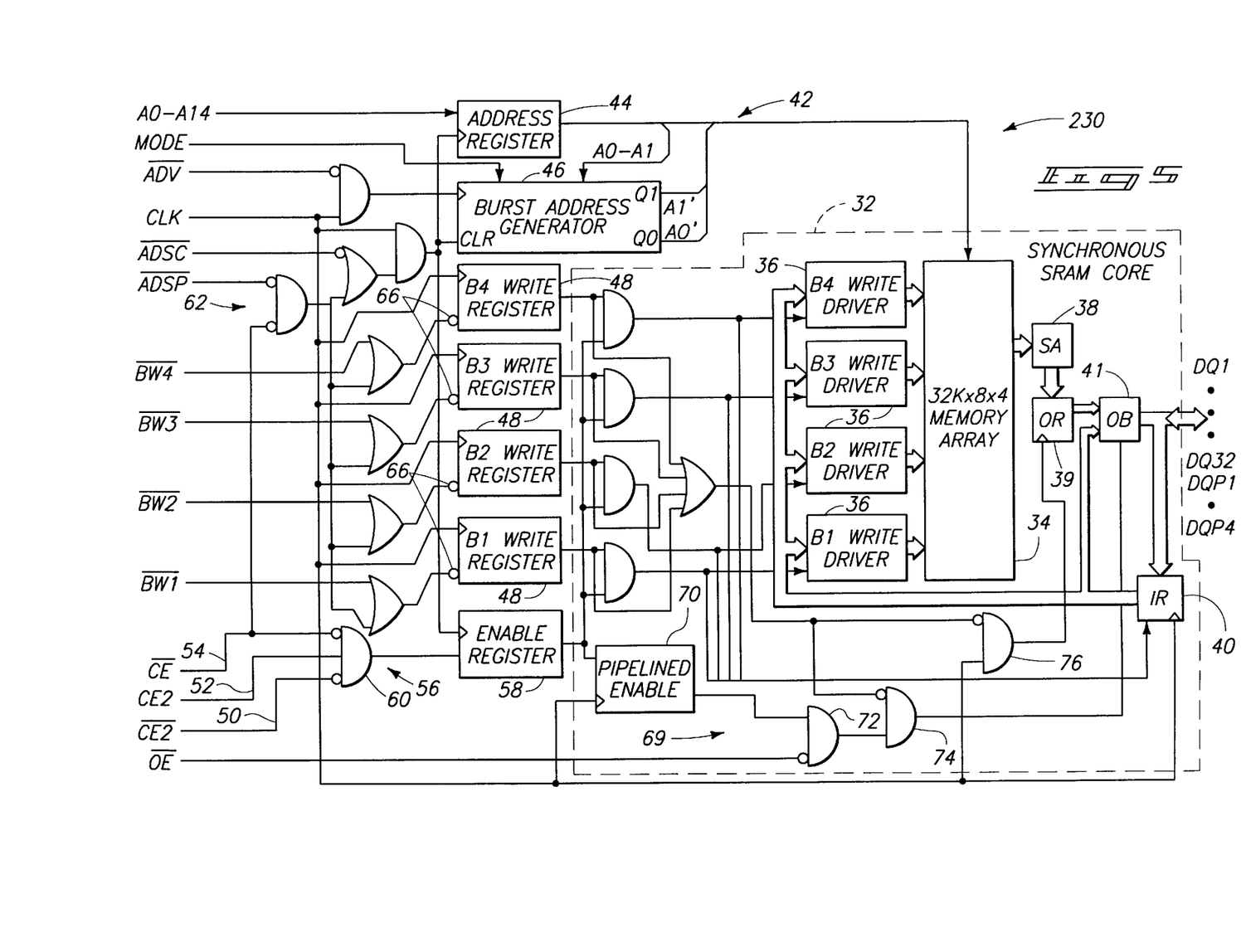
FIG. 5 is a block diagram of a synchronous burst SRAM device according to an alternative embodiment of the invention.

FIG. 5 shows an SRAM 230 in accordance with an alternative embodiment, like reference numerals indicating like components, wherein the global write circuitry and byte write enable circuitry is deleted. As shown in FIG. 5, the pipelined enable circuitry 69 can be advantageously employed whether or not the global write circuitry and/or byte write enable circuitry is present.

Figure 6:
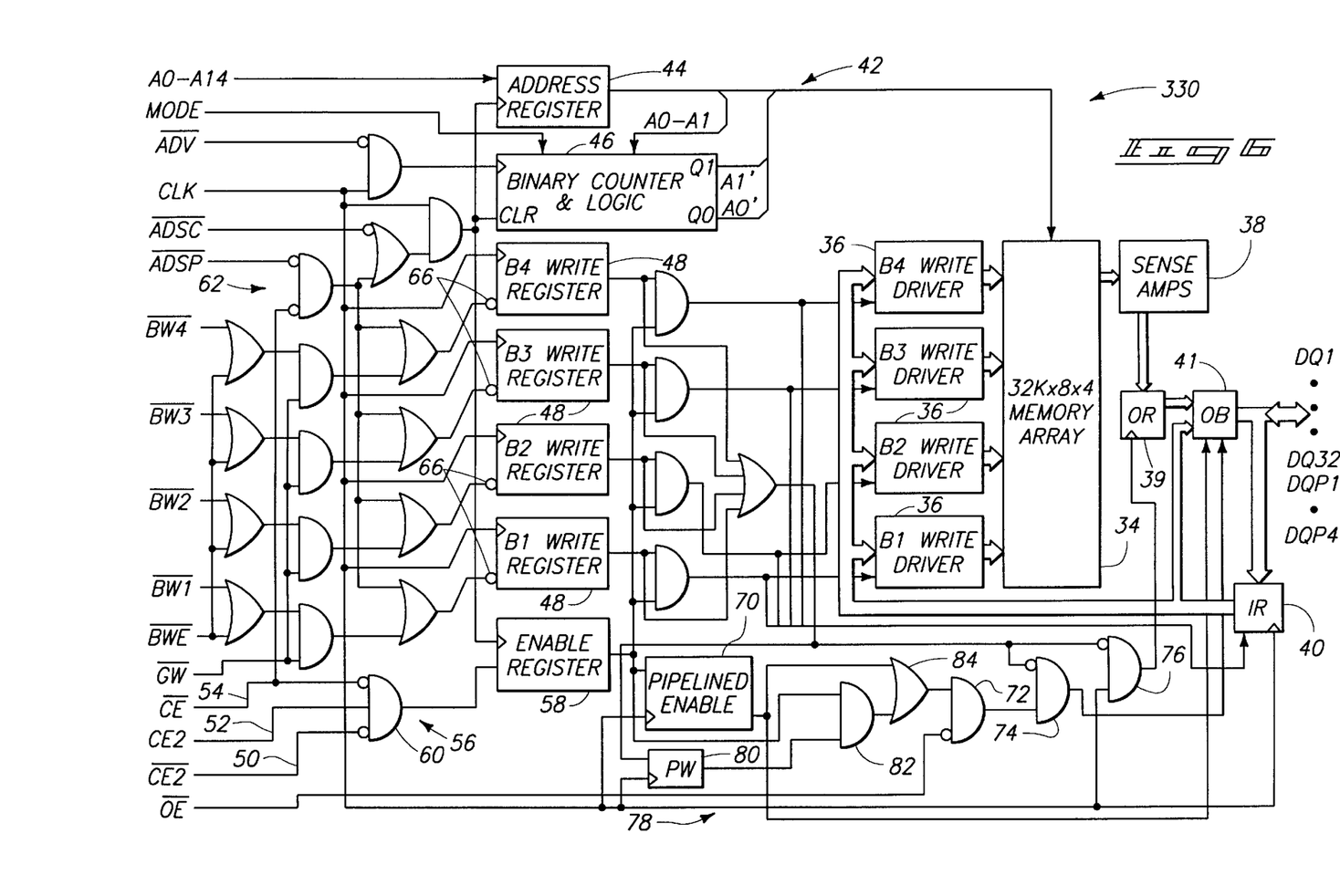
FIG. 6 is a block diagram of a synchronous burst SRAM device according to another alternative embodiment of the invention.

FIG. 6 shows an SRAM 330 in accordance with another alternative embodiment, like reference numerals indicating like components, which adds an output register bypass function. More particularly, the SRAM 330 includes output register bypass circuitry 78. The output register bypass circuitry 78 includes a one-bit previous write register 80 that has an input coupled to the logical OR of the outputs of all of the write registers 48, that is clocked by an external clock 210, and that has an output. The output register bypass circuitry 78 further includes an AND gate 82 having an input connected to the output of the previous write register 80, having an input connected to the output of the enable register 58, and having an output. The output register bypass circuitry 78 further includes an OR gate 84 having an input connected to the output of AND gate 82, having an input connected to the output of the pipelined enable register 70, and having an output connected to one of the inputs of the AND gate 72. The AND gate 72 has another input connected, via an inverter, to the output enable $\overline{OE}$, and an output connected to AND gate 74. The output register bypass circuitry 78, including previous write register 80, the AND gate 82, and the OR gate 84, allows data to propagate from the input registers 40 to the outputs DQ1–DQ32 and DQP1–DQP4 in a sequence where a write cycle is followed by a read cycle. In other words, the output register bypass circuitry 78 enables an output when a transition from a write to a read occurs.

Figure 7:
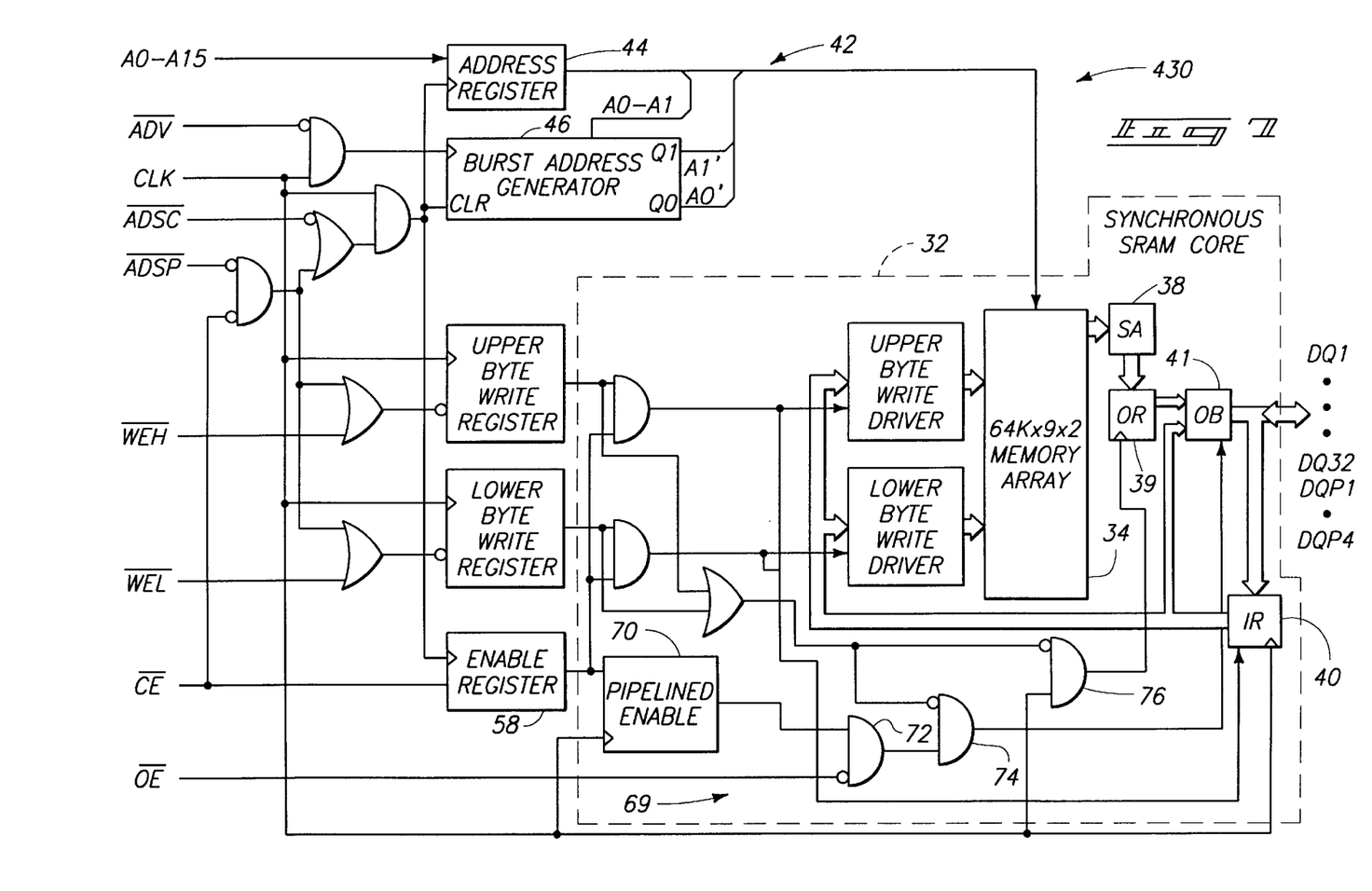
FIG. 7 is a block diagram of a synchronous burst SRAM device according to another alternative embodiment of the invention.

FIG. 7 shows an SRAM 440 in accordance with another alternative embodiment, like reference numerals indicating like components, wherein a different width is employed. More particularly, in the embodiment shown in FIG. 7, there are only two byte write registers (upper and lower), and only two byte write drivers (upper and lower). As shown in FIG. 7, the pipelined enable circuitry 69 can be advantageously employed in SRAMs of various widths.

Chip enable and select logic 56, enable register 58, pipelining logic 62, and pipelined enable circuitry 69 thereby provide device control circuitry for performing three desired functions: (1) selectively enabling or disabling the SRAM device, (2) selectively permitting access to the SRAM core when the SRAM device is enabled, and (3) selectively permitting pipelining operation of the SRAM device. The circuitry arrangement of this invention achieves these desired features, as well as the above described global write and byte write features, without introducing additional external logic or circuitry. Additionally, this invention accomplishes these desired results through the use of inexpensive logic design comprised of a few logical gates and registers. In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A synchronous burst SRAM device comprising:
    an, SRAM core having a memory array, write drivers, sense amplifiers, and I/O buffers;
    an address register configured to receive addresses for the memory array in the SRAM core, the addresses including address bits;

a burst address generator coupled to the address register and configured to rapidly generate additional addresses using an address bit stored in the address register;

an input configured to receive an external address signal indicating that an external address is ready to be loaded into the address register;

chip enable inputs configured to receive chip enable signals;

chip enable and select logic coupled to the chip enable inputs to selectively enable or disable the synchronous burst SRAM device and selectively permit access to the SRAM core when the SRAM device is enabled, in response to signals at the chip enable inputs, by outputting an SRAM core enable signal;

an enable register having an output, having an input coupled to the chip enable and select logic, and configured to temporarily store the SRAM core enable signal;

a pipelined enable register coupled between the enable register and the SRAM core and configured to temporarily store the SRAM core enable signal and delay propagation of the core enable signal to the SRAM core; and pipelining logic coupled to at least one of the chip enable inputs to block the external address signal when one chip enable signal received at the one chip enable input is at a selected asserted logic level.

2. A synchronous burst SRAM device according to claim 1 wherein the chip enable and select logic comprises an AND gate having three inputs defining the chip enable inputs and an output coupled to the enable register.

3. A synchronous burst SRAM device according to claim 1 wherein the chip enable and select logic outputs the SRAM core enable signal in response to a boolean function of the chip enable signals.

4. A synchronous burst SRAM device comprising:

an SRAM core having a memory array, write drivers, sense amplifiers, and output buffers;

a plurality of write registers coupled to the write drivers;

an address register configured to receive addresses for the memory array in the SRAM core;

a burst address generator coupled to the address register configured to rapidly generate additional addresses;

an input configured to receive an external address signal indicating that an external address is ready to be loaded into the address register;

chip enable inputs configured to receive chip enable signals;

chip enable and select logic coupled to the chip enable inputs to selectively enable or disable the synchronous burst SRAM device and selectively permit access to the SRAM core when the SRAM device is enabled in accordance with a boolean function of the chip enable signals at the chip enable inputs, the chip enable and select logic being configured to output an SRAM core enable signal resulting from the boolean function of the chip enable signals;

an enable register having an input coupled to the chip enable and select logic for temporarily storing the SRAM core enable signal, and having an output;

pipelined enable circuitry coupled between the enable register and the SRAM core, the pipelined enable circuitry including a pipelined enable register that has an input coupled to the output of the enable register, that has an output, and that is configured to temporarily store the SRAM core enable signal and delay propagation of the core enable signal to the SRAM core; and pipelining logic coupled to at least one of the chip enable inputs to block the external address signal when a chip enable signal received at the one chip enable input is at a selected asserted logic level.

5. A synchronous burst SRAM device according to claim 4 wherein the chip enable and select logic comprises an AND gate having three inputs defining the chip enable inputs and an output coupled to the enable register.

6. A synchronous burst SRAM device in accordance with claim 4 and further comprising a plurality of byte write registers respectively coupled to the write drivers, the byte write registers selectively activating corresponding write drivers to input data into the memory array during a write operation; a plurality of data inputs organized into bytes; a byte write enable input; a plurality of byte write inputs adapted to be respectively directly coupled to byte enable outputs of the processor; and byte write enable circuitry coupling the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs.

7. A synchronous burst SRAM device in accordance with claim 6 and further comprising a global write input coupled to the cache control logic, and global write circuitry coupling the global write input to the byte write registers and selectively causing all bytes of the data inputs to be written into the SRAM core when a predetermined asserted logic level is present on the global write input.

8. A synchronous burst SRAM device in accordance with claim 6 wherein the data inputs are organized into a predetermined number of bytes, and wherein the number of byte write registers is equal to this predetermined number of bytes.

9. A synchronous burst SRAM device in accordance with claim 6 and further including output register bypass circuitry coupled between the enable register and the memory core.

10. A synchronous burst SRAM device comprising:

an SRAM core having a memory array, write drivers, sense amplifiers, and output buffers;

a plurality of write registers coupled to the write drivers;

an address register configured to receive addresses for the memory array in the SRAM core;

a burst address generator coupled to the address register and configured to rapidly generate additional addresses using at least one address bit stored in the address register;

an input for receiving an external address signal indicating that an external address is ready to be loaded into the address register;

chip enable inputs configured to receive chip enable signals;

chip enable and select logic coupled to the chip enable inputs to selectively enable or disable the synchronous burst SRAM device and selectively permit access to the SRAM core when the SRAM device is enabled in accordance with a boolean function of the chip enable signals at the chip enable inputs, the chip enable and select logic outputting an SRAM core enable signal resulting from the boolean function of the chip enable signals;

an enable register having an input coupled to the chip enable, having an output, and select logic, and configured to temporarily store the SRAM core enable signal;

pipelined enable circuitry coupled between the enable register and the SRAM core, the pipelined enable circuitry including a pipelined enable register that has an input coupled to the output of the enable register, and that is configured to temporarily store the SRAM core enable signal and delay propagation of the core enable signal of the SRAM core;

output register bypass circuitry coupled between the enable register and the memory core, the output register bypass circuitry including a previous write register having an input coupled to the logical OR of all the outputs of the write registers, and having an output, the output register bypass circuitry further including an AND gate having an input coupled to the output of the previous write register, having an input coupled to the output of the enable register, and having an output, and the output register bypass circuitry further including an OR gate having an input coupled to the output of the AND gate, having an input coupled to the output of the pipelined enable register; and pipelining logic coupled to at least one of the chip enable inputs to block the external address signal when one chip enable signal received at the one chip enable input is at a selected asserted logic level to thereby permit pipelining operation of the synchronous burst SRAM device.

11. A synchronous burst SRAM device according to claim 10 wherein the chip enable and select logic comprises an AND gate having three inputs coupled to the chip enable inputs and an output coupled to the enable register.

12. A synchronous burst SRAM device in accordance with claim 10 and further comprising a plurality of byte write registers respectively coupled to the write drivers, the byte write registers selectively activating corresponding write drivers to input data into the memory array during a write operation; a plurality of data inputs organized into bytes; a byte write enable input; a plurality of byte write inputs adapted to be respectively directly coupled to byte enable outputs of the processor; and byte write enable circuitry coupling the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs.

13. A synchronous burst SRAM device in accordance with claim 12 and further comprising a global write input coupled to the cache control logic, and global write circuitry coupling the global write input to the byte write registers and selectively causing all bytes of the data inputs to be written into the SRAM core when a predetermined asserted logic level is present on the global write input.

14. A synchronous burst SRAM device in accordance with claim 12 wherein the data inputs are organized into a predetermined number of bytes, and wherein the number of byte write registers is equal to the predetermined number of bytes.

15. A system comprising:
a processor including a plurality of byte enable outputs;
control logic communicating with the processor;
a first synchronous SRAM communicating with the processor and the control logic, the first SRAM comprising:
  an SRAM core having a memory array, write drivers, sense amplifiers, and output buffers;
  address control circuitry means for accessing a selected location of the memory array within the SRAM core;
  a plurality of byte write registers respectively coupled to the write drivers, the byte write registers including means for selectively activating corresponding byte write drivers to input data into the memory array during a write operation;
  a plurality of data inputs organized into bytes;
  a byte write enable input;
  a plurality of byte write inputs respectively directly coupled to the byte enable outputs of the processor;
  byte write enable circuitry means for coupling the byte write inputs and the byte write enable input to the byte write registers and for selectively causing individual bytes of the data inputs to be written into the SRAM core when a predetermined asserted logic level is present on the byte write enable input and also depending on the asserted logic level on the individual byte write inputs;
  a global write input, and global write circuitry means for coupling the global write input to the byte write registers and for selectively causing all bytes of the data inputs to be written into the SRAM core when a predetermined asserted logic level is present on the global write input;
  first, second, and third chip enable input means for receiving at least a module enable signal and a memory select enable signal;
  chip enable and select logic means coupled to the first, second, and third chip enable inputs for selectively enabling or disabling the first synchronous burst SRAM and for selectively permitting access to the SRAM core when the first SRAM is enabled in accordance with a boolean function of the chip enable signals at the three chip enable inputs, the chip enable and select logic outputting an SRAM core enable signal resulting from the boolean function of the chip enable signals;
  enable register means having an input coupled to the chip enable and select logic for temporarily storing the SRAM core enable signal, and having an output;
  pipelined enable circuitry coupled between the enable register and the SRAM core, the pipelined enable circuitry including a pipelined enable register that has an input coupled to the output of the enable register, that has an output and that is configured to temporarily store the SRAM core enable signal and delay propagation of the core enable signal to the SRAM core;
  output register bypass circuitry coupled between the enable register and the SRAM core, the output register bypass circuitry including a previous write register having an input coupled to the logical OR of all the outputs of the byte write registers, and having an output, the output register bypass circuitry further including an AND gate having an input coupled to the output of the previous write register, having an input coupled to the output of the enable register, and having an output, and the output register bypass circuitry further including an OR gate having an input coupled to the output of the AND gate, having an input coupled to the output of the pipelined enable register; and
  pipelining logic means coupled to at least one of the three chip enable input means, for blocking the external address signal when one chip enable signal received at the one chip enable input is at a selected asserted logic level; and
a second synchronous SRAM communicating with the processor and the control logic, the second SRAM comprising:

an SRAM core having a memory array, write drivers, sense amplifiers, and output buffers;

address control circuitry for accessing a selected location of the memory array within the SRAM core of the second SRAM;

fourth, fifth, and sixth chip enable inputs for receiving at least a module enable signal and a memory select enable signal;

chip enable and select logic means coupled to the fourth, fifth, and sixth chip enable inputs for selectively enabling or disabling the second SRAM and for selectively permitting access to the SRAM core of the second SRAM when the second SRAM is enabled in accordance with a boolean function of the chip enable signals at the three chip enable inputs of the second SRAM, the chip enable and select logic of the second SRAM outputting an SRAM core enable signal resulting from the boolean function of the chip enable signals;

enable register means having an input coupled to the chip enable and select logic of the second SRAM for temporarily storing the SRAM core enable signal of the second SRAM, and having an output;

pipelined enable circuitry coupled between the enable register and the SRAM core of the second SRAM, the pipelined enable circuitry of the second SRAM including a pipelined enable register that has an input coupled to the output of the enable register of the second SRAM, that has an output, and that is configured to temporarily store the SRAM core enable signal an delay propagation of the core enable signal to the SRAM core;

output register bypass circuitry coupled between the enable register and the memory core of the second SRAM, the output register bypass circuitry of the second SRAM including a previous write register having an input coupled to the logical OR of all the outputs of the byte write registers of the second SRAM, and having an output, the output register bypass circuitry further including a second AND gate having an input coupled to the output of the previous write register of the second SRAM, having an input coupled to the output of the enable register of the second SRAM, and having an output, and the output register bypass circuitry of the second SRAM further including an OR gate having an input coupled to the output of the second AND gate, having an input coupled to the output of the pipelined enable register; and pipelining logic means coupled to at least one of the fourth, fifth, and sixth chip enable inputs for blocking the external address signal when one chip enable signal received at the one chip enable input is at a selected asserted logic level;

means for providing a memory select enable signal selecting the first SRAM when the memory select enable signal is at one asserted logic level and selecting the second SRAM when the memory select enable signal is at another asserted logic level; and means for providing a module enable signal enabling operation of both SRAMs when the module enable signal is at one asserted logic level and disabling operation of both SRAMs when the module enable signal is at another asserted logic level.

16. A system in accordance with claim 15 wherein predetermined byte write inputs of the first SRAM are associated with predetermined bytes of the data inputs of the first SRAM so that predetermined bytes of the data inputs can be selected using individual byte write inputs.

17. A system in accordance with claim 15 wherein predetermined byte write inputs of the second SRAM are associated with predetermined bytes of the data inputs of the second SRAM so that predetermined bytes of the data inputs can be selected using individual byte write inputs.

* * * * *

UNITED STATES PATENT AND TRADEMARK OFFICE
CERTIFICATE OF CORRECTION

PATENT NO.   : 6,094,703
DATED        : July 25, 2000
INVENTOR(S)  : J. Thomas Pawlowski It is certified that error appears in the above-identified patent and that said Letters Patent are hereby corrected as shown below:

Change the Title to--SYNCHRONOUS SRAM HAVING PIPELINED ENABLE--
Column 1, line 53, delete --is--, first occurrence
Column 2, line 56, delete --la--
Column 7, line 60, delete --a--
Column 8, line 58, delete --is--
Column 11, line 12, delete --a--
Column 12, line 7, delete --ii--

Signed and Sealed this

Fifteenth Day of May, 2001

Attest:

NICHOLAS P. GODICI

Attesting Officer    Acting Director of the United States Patent and Trademark Office